(12) United States Patent
Lee et al.

(10) Patent No.: US 9,977,071 B2
(45) Date of Patent: May 22, 2018

(54) TEST DEVICE FOR TESTING PLURALITY OF SAMPLES AND OPERATING METHOD THEREOF

(71) Applicants: Jong Min Lee, Daejeon (KR); Chull Won Ju, Daejeon (KR); Byoung Gue Min, Sejong (KR)

(72) Inventors: Jong Min Lee, Daejeon (KR); Chull Won Ju, Daejeon (KR); Byoung Gue Min, Sejong (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 823 days.

(21) Appl. No.: 14/302,354

(22) Filed: Jun. 11, 2014

(65) Prior Publication Data

US 2015/0177309 A1 Jun. 25, 2015

(30) Foreign Application Priority Data

Dec. 23, 2013 (KR) .................. 10-2013-0161400

(51) Int. Cl.
*G01R 31/26* (2014.01)

(52) U.S. Cl.
CPC ..... *G01R 31/2621* (2013.01); *G01R 31/2608* (2013.01)

(58) Field of Classification Search
CPC ........... G01R 31/2621; G01R 31/2608; G01R 19/04; G01R 27/02; G01R 21/01
USPC ... 324/500, 750.01–750.07, 308–321, 76.11, 324/76.15, 76.38, 76.58, 750.1, 754.1; 701/34.4; 429/61; 702/63
See application file for complete search history.

(56) References Cited

U.S. PATENT DOCUMENTS

| 6,359,460 B1 * | 3/2002 | Tanaka ................. G01D 3/036 324/756.06 |
| 2004/0021076 A1 * | 2/2004 | Kadyshevitch ........ G01N 23/00 250/310 |

* cited by examiner

*Primary Examiner* — Melissa Koval
*Assistant Examiner* — Trung Nguyen

(57) ABSTRACT

A test device includes: a testing unit connected with a measurement line, and configured to apply bias to the measurement line and measure the measurement line; a plurality of switching units configured to electrically connect the measurement line and the plurality of samples; and a control unit configured to sequentially turn on the plurality of switching units to sequentially apply the bias to the plurality of samples. The control unit determines whether a corresponding device sample has a defect based on a first measurement value according to measurement by the testing unit when the bias is applied to each of the plurality of samples.

9 Claims, 6 Drawing Sheets

FIG. 6

| | sample | 1 | ... | k-1 | k | k+1 | ... | n |
|---|---|---|---|---|---|---|---|---|
| 1 | Initial individual sample test | X → | X → | X → | O → | X → | X → | X |
| 2 | First reliability test | O | O | O | O | O | O | O |
| 3 | Middle individual sample test | X → | X → | X → | fail → | X → | X → | X |
| 4 | Second reliability test | O | O | O | Measurement excluded | O | O | O |
| 5 | Final individual sample test | X → | X → | O → | Measurement excluded → | X → | X → | X |

O : switch on
X : switch off

TEST DEVICE FOR TESTING PLURALITY OF SAMPLES AND OPERATING METHOD THEREOF

CROSS-REFERENCE TO RELATED APPLICATION

This application is based on and claims priority from Korean Patent Application No. 10-2013-0161400, filed on Dec. 23, 2013, with the Korean Intellectual Property Office, the disclosure of which is incorporated herein in its entirety by reference.

BACKGROUND

1. Field

The present invention relates to an electronic device, and more particularly, to a test device for testing a plurality of samples, and an operating method thereof.

2. Discussion of Related Art

Every electronic good currently include various electronic devices. The electronic good needs to meet a predetermined level of reliability or higher. The reliability means whether a sample performs a demanded function under a given condition for a given period. Here, the sample may be any one among various elements forming the electronic good, and includes, for example, an individual element, a function unit, a component, a device, a sub system, and a system.

A reliability test of an electronic device is performed according to a type of tested sample. For example, a condition and a reference of the test may be changed according to whether a type of device sample is a Field Effect Transistor (FET) and a Bipolar Junction Transistor (BJT), or whether a device sample is based on Si or a compound, such as GaAs, InP, and GaN.

The reliability test of the electronic device may be divided into a test applying bias and a test applying no bias, and the test is performed with a predetermined number or more of multi samples in order to have a statistical meaning during the test.

In a case of the test applying the bias, a test condition for the same type of samples is determined considering an upper limit and a lower limit of a condition under which the device is destructed, and an upper limit and a lower limit of a condition under which an operation of the device is enabled.

When the test condition is determined, a test zig appropriate to a corresponding sample is determined and the test is performed by connecting a power source for each test zig. That is, when it is desired to measure N sample, a plurality of power sources for operating the N samples, respectively, is necessary, and when the power sources do not have a measurement function, a separate measurement device corresponding to each power source is necessary.

The number and type of input terminals are changed according to the type of electronic device. In a case of a diode that is a 2-port device, one power source and one measurement device are demanded for one device, but in a case of a 3-port device, such as the BJT and the FET, two power sources and two measurement devices are demanded for one device. When the number of samples is increased, a configuration of a system demanded for the test becomes more complex, and costs are increased.

In order to have reliability of 95% or more during the reliability test, several hundreds of samples need to be tested, and a test zig for each sample, and a power source and a measurement device for driving each sample are demanded. During the test of a Radio Frequency (RF) device, the test is performed while applying an RF signal to each sample, so that a large number of expensive equipment is necessary.

SUMMARY

The present invention has been made in an effort to efficiently configure a test system demanded while testing specific samples.

An exemplary embodiment of the present invention provides a test device, including: a testing unit connected with a measurement line, and configured to apply bias to the measurement line and measure the measurement line; a plurality of switching units configured to electrically connect the measurement line and the plurality of samples; and a control unit configured to sequentially turn on the plurality of switching units to sequentially apply the bias to the plurality of samples. The control unit determines whether a corresponding device sample has a defect based on a first measurement value according to measurement by the testing unit when the bias is applied to each of the plurality of samples.

As the exemplary embodiment, the control unit may control the plurality of switching units so that the plurality of samples is biased by the testing unit before sequentially turning on the plurality of switching units.

As the exemplary embodiment, the control unit may control the plurality of switching units so that second samples, except for one or more first device samples determined to have the defect among the plurality of samples, are biased by the testing unit.

As the exemplary embodiment, the control unit may sequentially bias the second samples by sequentially turning on switching units corresponding to the second samples after the second samples are biased.

As the exemplary embodiment, the control unit may determine whether a corresponding device sample has a defect based on a second measurement value according to measurement by the testing unit when each of the plurality of samples is biased.

As the exemplary embodiment, the control unit may bias the plurality of samples by turning on the plurality of switching units, and then sequentially turn on the plurality of switching units.

As the exemplary embodiment, the control unit may receive a second measurement value according to the measurement by the testing unit when the plurality of samples is commonly biased, and sequentially turn on the plurality of switching units according to the second measurement value.

As the exemplary embodiment, the control unit may compare the second measurement value with a reference value, and sequentially turn on the plurality of switching units according to a result of the comparison.

As the exemplary embodiment, the control unit may bias the plurality of samples by turning on the plurality of switching units for a specific time, and then sequentially turn on the plurality of switching units after elapse of the specific time.

As the exemplary embodiment, the testing device may further include a measurement device configured to measure a bias value applied to a corresponding sample through one among the plurality of switching units, in which the control unit may compare a measurement value of the measurement device with a bias value applied by the testing unit, and control the testing unit so as to adjust the bias value applied by the testing unit according to a result of the comparison.

Another exemplary embodiment of the present invention provides a test device, including: a first testing unit connected to a first terminal among the plurality of terminals of each of the plurality of samples, and configured to commonly bias the first terminals of the plurality of samples; a second testing unit connected with a measurement line, and configured to bias the measurement line and measure the measurement line; a plurality of switching units connected between the measurement line and a second terminal among the plurality of terminals of each of the plurality of samples; and a control unit configured to sequentially turn on the plurality of switching units to sequentially bias the second terminals of the plurality of samples. The control unit determines whether a corresponding sample has a defect based on a first measurement value according to measurement by the second testing unit when each of the second terminals of the plurality of samples is biased.

As the exemplary embodiment, the control unit may bias the second terminals of the plurality of samples by turning on the plurality of switching units, and then sequentially turn on the plurality of switching units.

As the exemplary embodiment, the control unit may control the plurality of switching units so that the second terminals of the second samples, except for a first sample having the defect among the plurality of samples, may be biased.

As the exemplary embodiment, the control unit may sequentially bias the second terminals of the second samples by sequentially turning on the switching units connected to the second samples after the second terminals of the second samples are biased.

As the exemplary embodiment, the control unit may determine whether a corresponding sample has a defect based on a second measurement value according to the measurement by the second testing unit when each of the second terminals of the plurality of samples is biased.

As the exemplary embodiment, the first testing unit may measure the first terminals while biasing the first terminals.

As the exemplary embodiment, the test device may further include a measurement device configured to measure any one among the second terminals of the plurality of samples, in which the control unit may compare a measurement value of the measurement device with a bias value applied by the second testing unit, and control the second testing unit so as to adjust the bias value applied by the second testing unit according to a result of the comparison.

Yet another exemplary example of the present invention relates to a method of testing a plurality of samples. The method includes: sequentially turning on a plurality of switching units connected between a plurality of samples and a bias source to sequentially bias the plurality of samples from the bias source; detecting a first sample having a defect among the plurality of samples by measuring an output value of a corresponding sample when each of the plurality of samples is biased; and commonly turning on switching units connected to second samples, except for the first sample among the plurality of samples to bias the second samples from the bias source.

As the exemplary embodiment, the method may further include sequentially biasing the second samples by sequentially turning on the switching units connected to the second samples after the second samples are biased.

As the exemplary embodiment, the method may further include detecting a third sample having a defect among the second samples by measuring an output value of a corresponding sample when each of the second samples is biased.

As the exemplary embodiment, the plurality of samples may be sequentially biased after the plurality of samples is biased by the testing unit by commonly turning on the plurality of switching units.

According to the exemplary embodiment of the present invention, it is possible to efficiently configure a test system demanded while testing specific samples.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which:

FIG. 6 is a diagram for describing the method of testing the plurality of samples in more detail.

DETAILED DESCRIPTION

Hereinafter, an embodiment of the present invention will be described with reference to the accompanying drawings in detail. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains, and the scope of the present invention should be understood by the claims of the present invention.

Throughout this specification and the claims that follow, when it is described that an element is "coupled" to another element, the element may be "directly coupled" to the other element or "electrically coupled" to the other element through a third element. Throughout the specification and the claims, unless explicitly described to the contrary, the word "comprise" and variations such as "comprises" or "comprising" will be understood to imply the inclusion of stated elements but not the exclusion of any other elements.

Figure 1:
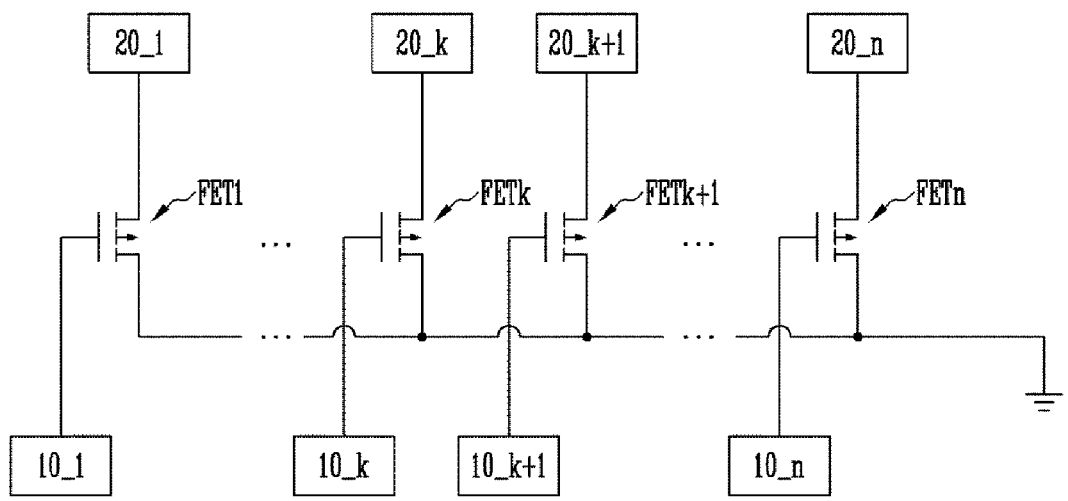
FIG. 1 is a diagram illustrating a test system for testing a plurality of FETs.

FIG. 1 is a diagram illustrating a test system 1 for testing a plurality of FETs.

Referring to FIG. 1, the test system 1 includes a plurality of first testing units 10_1 to 10_n, a plurality of FETS FET1 to FETn, and a plurality of second testing units 20_1 to 20_n.

The plurality of FETS FET1 to FETn is provided as device samples. Here, the device samples may be any type of electronic devices among electronic devices, in addition to the plurality of FETS FET1 to FETn, and the device sample is a FET in the present exemplary embodiment for convenience of the description.

The FET is a device having three terminals, and names of the terminals are called a source terminal, a drain terminal, and a gate terminal, respectively. A ground voltage is applied to the source terminal of the plurality of FETS FET1 to FETn. Further, as illustrated in FIG. 1, in order to drive the $k^{th}$ FET FETk, a first testing unit 10_$k$ formed to supply specific bias is connected to the gate terminal, and a second testing unit 20_$k$ formed to provide another bias is connected to the drain terminal ($k$ is an integer, and 1≤$k$≤n). As described above, in order to drive each FET, two testing units 10_$k$ and 20_$k$ are demanded, and thus, in order to drive the entire FETS FET1 to FETn, 2*n testing units 10_1 to 10_$n$ and 20_1 to 20_$n$ are demanded.

When each testing unit does not have a multimeter function, a current meter for measuring a characteristic of a corresponding FET is further demanded in the gate terminal and the source terminal. In this case, the two testing units and two additional current meters are additionally demanded in order to drive each FET, so that in order to drive the entire FETS FET1 to FETn, four times of the number of entire FETs FET1 to FETn of equipment are demanded.

In this case, a configuration of the test system 1 is very complex, an occupied area of the test system 1 is increased, and costs for establishing the test system 1 are increased.

Figure 2:
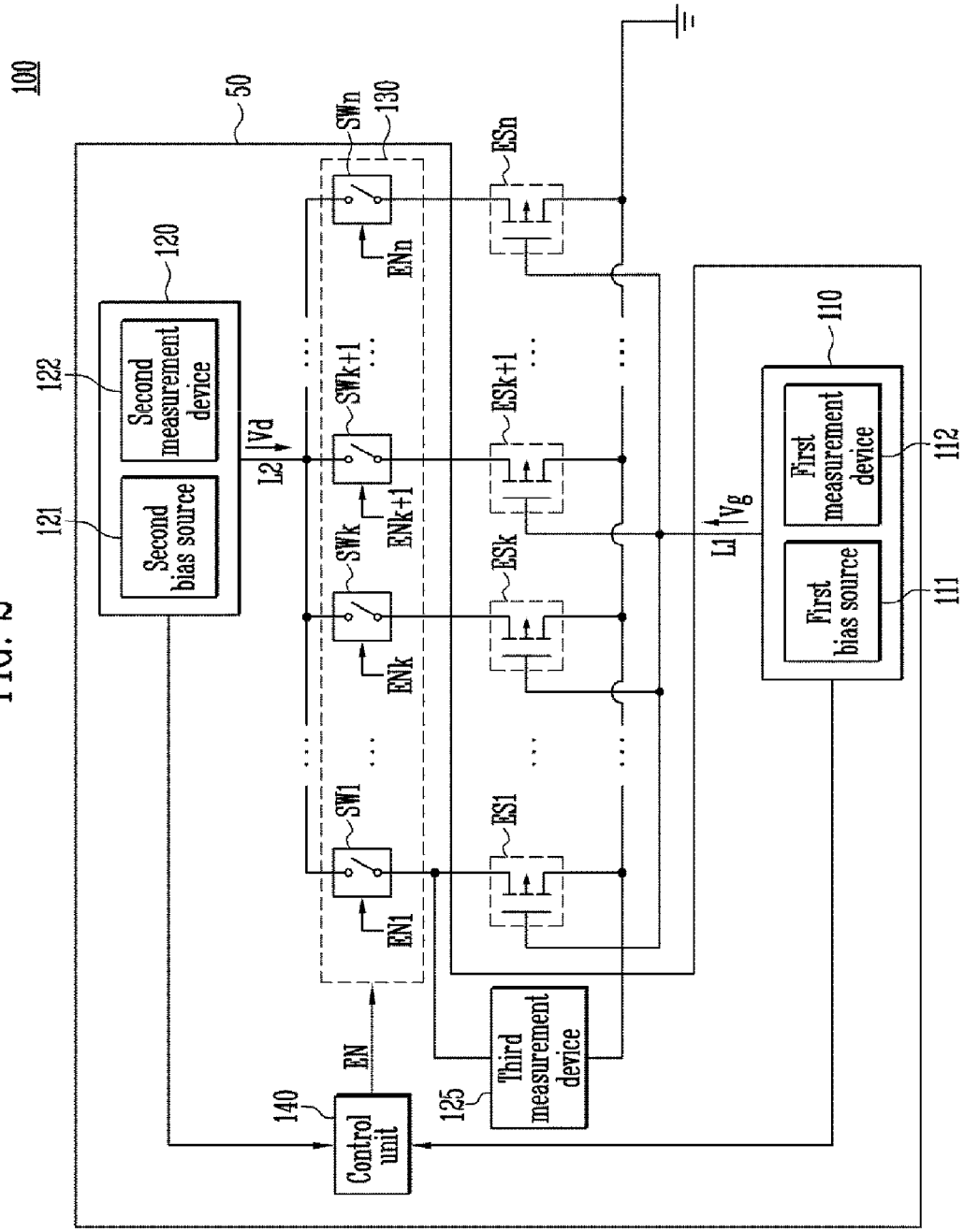
FIG. 2 is a diagram illustrating a test system according to an exemplary embodiment of the present invention for testing a plurality of samples.

FIG. 2 is a test system 100 according to an exemplary embodiment of the present invention for testing a plurality of samples ES1 to ESn.

Referring to FIG. 2, the test system 100 includes a test device 50 and a plurality of samples ES1 to ESn.

The test device 50 includes a first testing unit 110, a second testing unit 120, a third measurement device 125, a switching block 130, and a control unit 140.

The first testing unit 110 is commonly connected to gate terminals of the plurality of samples ES1 to ESn through a first measurement line L1. The first testing unit 110 includes a first bias source 111 and a first measurement device 112.

The first bias source 111 is configured to output a gate voltage Vg through the first measurement line L1 to commonly bias the gate terminals of the plurality of samples ES1 to ESn.

The first measurement device 112 is configured to measure the first measurement line L1 and transmit a measurement value according to the measurement to the control unit 140. For example, the first measurement device 112 is configured to measure a current value of the first measurement line L1 and output a measurement result to the control unit 140.

The second testing unit 120 is connected with first to $n^{th}$ switching units SW1 to SWn through a second measurement line L2. The second testing unit 120 includes a second bias source 121 and a second measurement device 122.

The second bias source 121 is configured to bias the second measurement line L2. The second bias source 121 is configured to output a drain voltage Vd through the second measurement line L2.

The second measurement device 122 is configured to measure the second measurement line L2 and transmit a measurement value according to the measurement to the control unit 140. For example, the second measurement device 122 is configured to measure a current value or a voltage value of the second measurement line L2 and output a measurement result to the control unit 140. When the sample is the FET as illustrated in FIG. 2, the measurement value may be a current value of the second measurement line L2.

The third measurement device 125 is connected with a source terminal and a drain terminal of one sample ES1 among the plurality of samples. The third measurement device 125 is configured to measure a bias value applied to the drain terminal of the first sample ES1. The third measurement device 125 is provided in order to confirm and compensate for a loss value when the switching block 130 is provided. The bias value supplied by the second bias source 121 and a bias value measured by the third measurement device 125 need to be the same in a case of an ideal case. Existence of a difference between both bias values means generation of voltage drop by the switching block 130. In order to secure accuracy of the measurement, the control unit 140 compares a measurement value of the third measurement device 125 and a bias value applied to the second measurement line L2 by the second bias source 121, and adjusts a bias value by the second bias source 121 according to a comparison result. For example, the control unit 140 may control the second bias source 121 so as to increase a voltage applied to the second measurement line L2 according to the comparison result.

The switching block 130 is connected between the second measurement line L2 and the plurality of samples ES1 to ESn. The switching block 130 receives enable signals EN from the control unit 140, and electrically connects the second measurement line L2 and the plurality of samples ES1 to ESn according to the received enable signals EN.

The enable signals EN is formed of first to $n^{th}$ enable signals EN1 to ENn, and the first to $n^{th}$ enable signals EN1 to ENn are provided to the first to $n^{th}$ switching units SW1 to SWn, respectively.

The switching block 130 includes the first to $n^{th}$ switching units SW1 to SWn. The first to $n^{th}$ switching units SW1 to SWn connects the second measurement line L2 and the first to $n^{th}$ samples ES1 to ESn, respectively. The first to $n^{th}$ switching units SW1 to SWn are turned on or turned off in response to the first to $n^{th}$ enable signals EN1 to ENn.

The control unit 140 sequentially turns on the first to $n^{th}$ switching units SW1 to SWn to bias a drain terminal of each sample through the second measurement line L2 from the second bias source 121. In this case, when the drain terminal of each sample is biased, the control unit 140 receives a measurement value measured by the second measurement device 120, and determines whether the corresponding sample has a defect based on the received measurement value. For example, the control unit 140 compares the measurement value measured by the second measurement device 120 with a threshold value, and determines whether the corresponding sample has a defect based on a comparison result.

Although not illustrated in FIG. 2, a semiconductor analyzer may be additionally provided for more accurate measurement. The semiconductor analyzer may be connected to the plurality of samples ES1 to ESn through the switching block 130 similar to the second testing unit 120.

According to the exemplary embodiment of FIG. 2, the test system includes the first testing unit for commonly applying bias to the gate terminals of the plurality of samples ES1 to ESn, the second testing unit 120 for applying bias to the drain terminals of the plurality of samples ES1 to ESn, and the switching units SW1 to SWn connected between the second testing unit 120 and the plurality of samples ES1 to ESn. In comparison with the exemplary embodiment of FIG.

1, the switching block 130 is added, but the number of testing units 110 and 120 is decreased, thereby achieving simplification of the test system 100.

Figure 3:
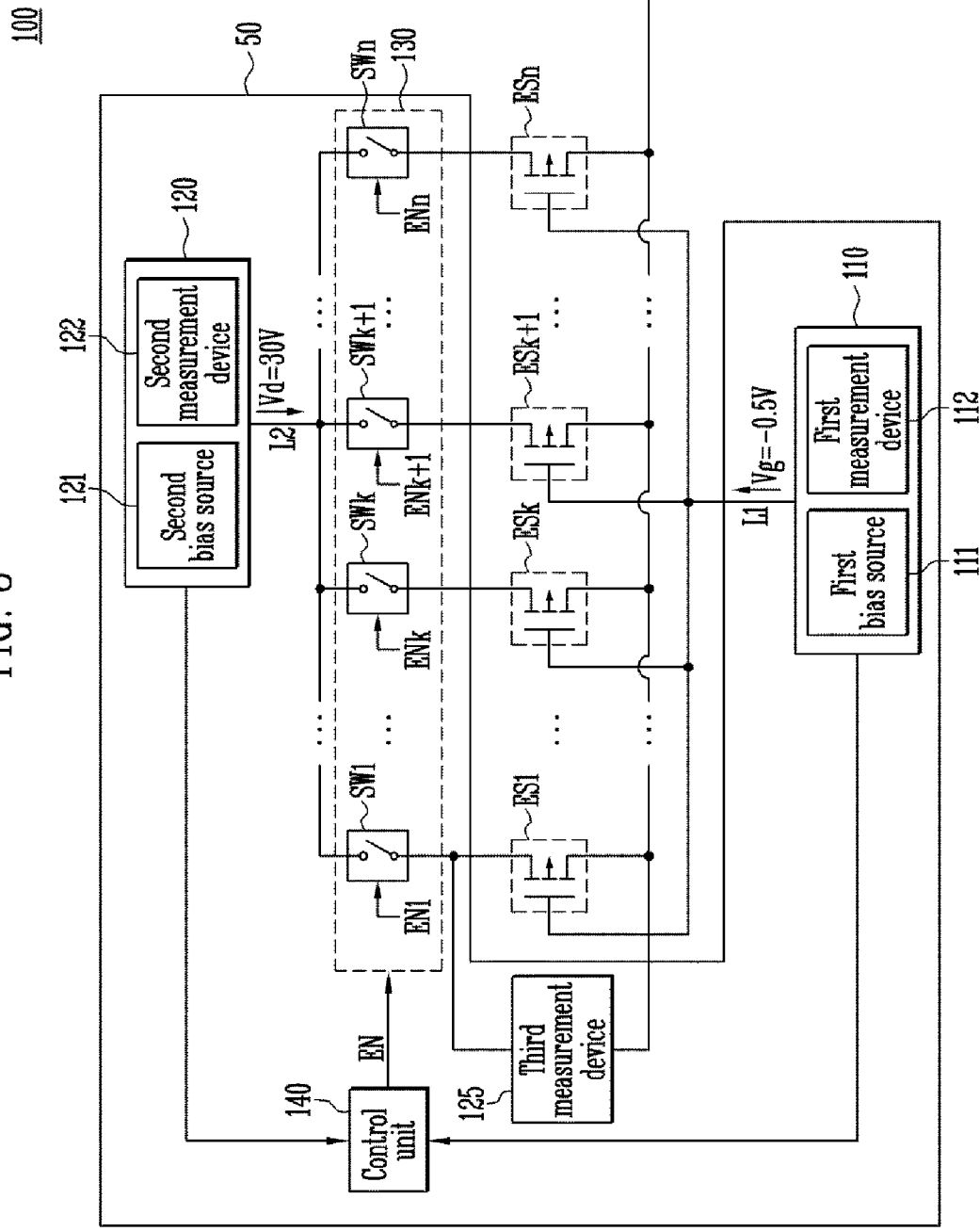
FIG. 3 is a diagram illustrating an example of bias voltages applied from first and second testing units.
Figure 4:
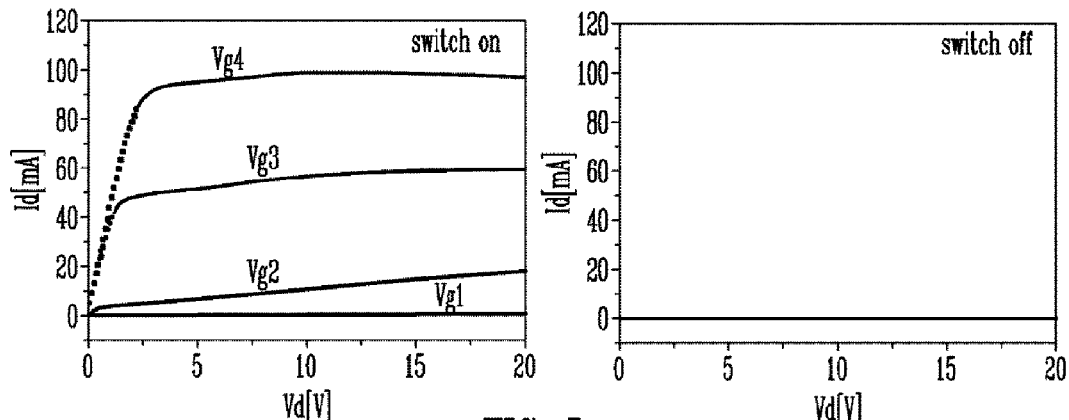
FIG. 4 is a diagram illustrating an example of a characteristic of a sample measured when a corresponding switching unit is turned on/off.

FIG. 3 illustrates an example of bias voltages applied from the first and second testing units 110 and 120. FIG. 4 illustrates an example of a characteristic of a sample measured when a corresponding switching unit is turned on/off.

Referring to FIG. 3, the first testing unit 110 provides a gate voltage Vg of −0.5 V. The gate voltage Vg of −0.5 V may be transferred to the gate of each sample through the first measurement line L1.

The second testing unit 120 provides a drain voltage Vd of 30 V. The measurement may be performed while individually applying the drain voltage Vd of 30 V to each sample by using the n switching units SW1 to SWn.

For example, a $k^{th}$ switching unit SWk corresponding to a $k^{th}$ sample ESk may be turned on for the measurement of the $k^{th}$ sample ESk, and the remaining switching units SW1 to SWk−1, and SWk+1 to SWn may be turned off. Accordingly, the $k^{th}$ sample ESk may be biased and measured by using the first testing unit 110 and the second testing unit 120. Although a voltage of −0.5 V is supplied to the gate terminals of the samples ES1 to ESk−1, and ESk+1 to ESn other than the $k^{th}$ sample ESk, but the drain terminals of the samples ES1 to ESk−1, and ESk+1 to ESn are opened, so that a characteristic of the $k^{th}$ sample ESk may be measured.

Referring to FIG. 4, a horizontal axis indicates a voltage applied to the drain terminal, and a vertical axis indicates a current measured at the drain terminal. When the switching unit is turned on, that is, the drain terminal is biased, as a voltage of the drain terminal is increased, a current flowing in the drain terminal is increased. In this case, a relationship between the voltage and the current of the drain terminal may be changed according to voltages Vg1 to Vg4 applied to the gate terminal.

When the switching unit is turned off, that is, the drain terminal is opened, the current flowing to the drain terminal is 0.

As a result, the characteristic of the corresponding sample may be measured only when the switching unit is turned on, and when the switching unit is turned on, the drain terminal of the corresponding sample is opened, so that although the bias is applied to the gate terminal, the corresponding sample is not operated. Finally, only the sample connected to the switching unit, which is in the turned-on state, is operated, and in this case, the measurement value (for example, the current value) measured by the second measurement device 122 is related to the corresponding sample.

Through the aforementioned method, a characteristic of an individual sample may be measured.

Figure 5:
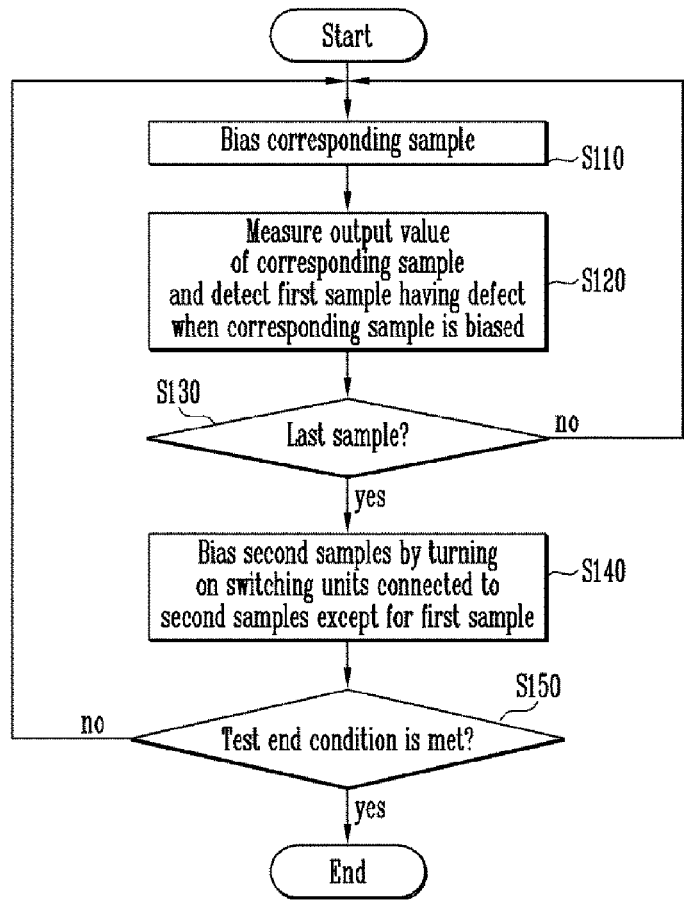
FIG. 5 is a flowchart illustrating a method of testing a plurality of samples.

FIG. 5 is a flowchart illustrating a method of testing the plurality of samples ES1 to ESn.

Referring to FIGS. 2 and 5, in step S110, the test device 50 biases a corresponding sample by turning on each of the plurality of switching units SW1 to SWn. In step S120, the test device 50 measures an output value of a corresponding sample when each sample is biased, and detects a first sample having a defect among the plurality of samples ES1 to ESn. The corresponding sample outputs the output value, for example, a specific current value, through the second measurement line L2, and the current value is measured by the second measurement device 122. The measured measurement value is transmitted to the control unit 140, so that whether the corresponding sample has a defect is determined.

In step S130, whether the measurement sample is the last sample is determined, and step 110 or step 140 is performed according to a result of the determination in step S130. That is, by repeatedly performing steps S110 and S120, the first to $n^{th}$ samples ES1 to ESn are tested.

In step S140, the test device 50 turns on the switching units connected with the second samples, except for the first sample determined to have the defect, and commonly biases the second samples. The control unit 140 may control the enable signals EN so that the switching units connected to the second samples are turned on.

Accordingly, the second samples, except for the first sample, may be commonly tested.

As an exemplary embodiment, the second measurement device 122 may measure the second measurement line L2 and transmit a measurement value according to the measurement to the control unit 140 when step S140 is performed. The control unit 140 may compare the measurement value with a reference value, and end step S140 according to a comparison result. For example, when the measured current value is decreased to reach the reference value, the control unit 140 may end step S140.

As an exemplary embodiment, the measurement of the first measurement device 112, as well as the measurement value of the second measurement device 122, may be transmitted to the control unit 140 when step S140 is performed. In this case, the control unit 140 may end step S140 based on the measurement value of the second measurement device 122 and the measurement of the first measurement device 112.

As an exemplary embodiment, step S140 may be performed for a predetermined time. That is, the second samples, except for the first sample determined to have the defect, may be continuously biased for a predetermined time.

In step S150, the test is ended according to whether the test meets a test end condition. For example, a loop formed of steps S110 to S140 is repeated by the predetermined number of times, the test end condition may be met. For example, when the test time reaches a target time, the test end condition may be met.

FIG. 6 is a diagram for describing the method of testing the plurality of samples ES1 to ESn in more detail.

Referring to FIGS. 2 and 6, a test for an initial individual sample is first performed. The control unit 140 sequentially applies bias to the first to $n^{th}$ samples ES1 to ESn by sequentially turning on the first to $n^{th}$ switching units SW1 to SWn corresponding to the first to $n^{th}$ samples ES1 to ESn.

When the bias is applied to each of the first to $n^{th}$ samples ES1 to ESn, the control unit 140 determines whether a corresponding sample has a defect based on a first measurement value according to measurement by the second measurement device 122.

It is assumed that all of the first to $n^{th}$ samples ES1 to ESn pass the test. Then, a first reliability test is performed. The control unit 140 commonly biases the first to $n^{th}$ samples ES1 to ESn by turning on the first to $n^{th}$ switching units SW1 to SWn.

As an exemplary embodiment, when the first to $n^{th}$ switching units SW1 to SWn are commonly biased, the control unit 140 may receive a second measurement value according to measurement by the second measurement device 122, and end the first reliability test according to the second measurement value.

When the first reliability test is ended, a test for a middle individual sample is performed. The control unit 140 determines whether the corresponding sample has a defect by receiving a third measurement value according to the measurement by the second measurement device 122 while applying the bias to each of the first to $n^{th}$ samples ES1 to ESn.

It is assumed that a $k^{th}$ sample ESK among the first to $n^{th}$ samples ES1 to ESn has a defect.

Then, a second reliability test is performed. The control unit 140 biases samples ES1 to ESk−1, and ESk+1 to ESn except for the $k^{th}$ sample ESk determined to have the defect by turning on the corresponding switching units SW1 to SWk−1, and SWk+1 to SWn.

As an exemplary embodiment, when the samples ES1 to ESk−1, and ESk+1 to ESn except for the $k^{th}$ sample ESk are biased, the control unit may receive a fourth measurement value according to the measurement by the second measurement device 122, and end the second reliability test according to the fourth measurement value.

Then, the test for a final individual sample is performed. The control unit 140 determines whether the corresponding sample has a defect by receiving a fifth measurement value according to the measurement by the second measurement device 122 while applying the bias to each of the samples ES1 to ESk−1, and ESk+1 to ESn except for the $k^{th}$ sample ESk determined to have the defect.

Through the method, the test for the individual sample and the reliability test may be repeated.

Figure 7:
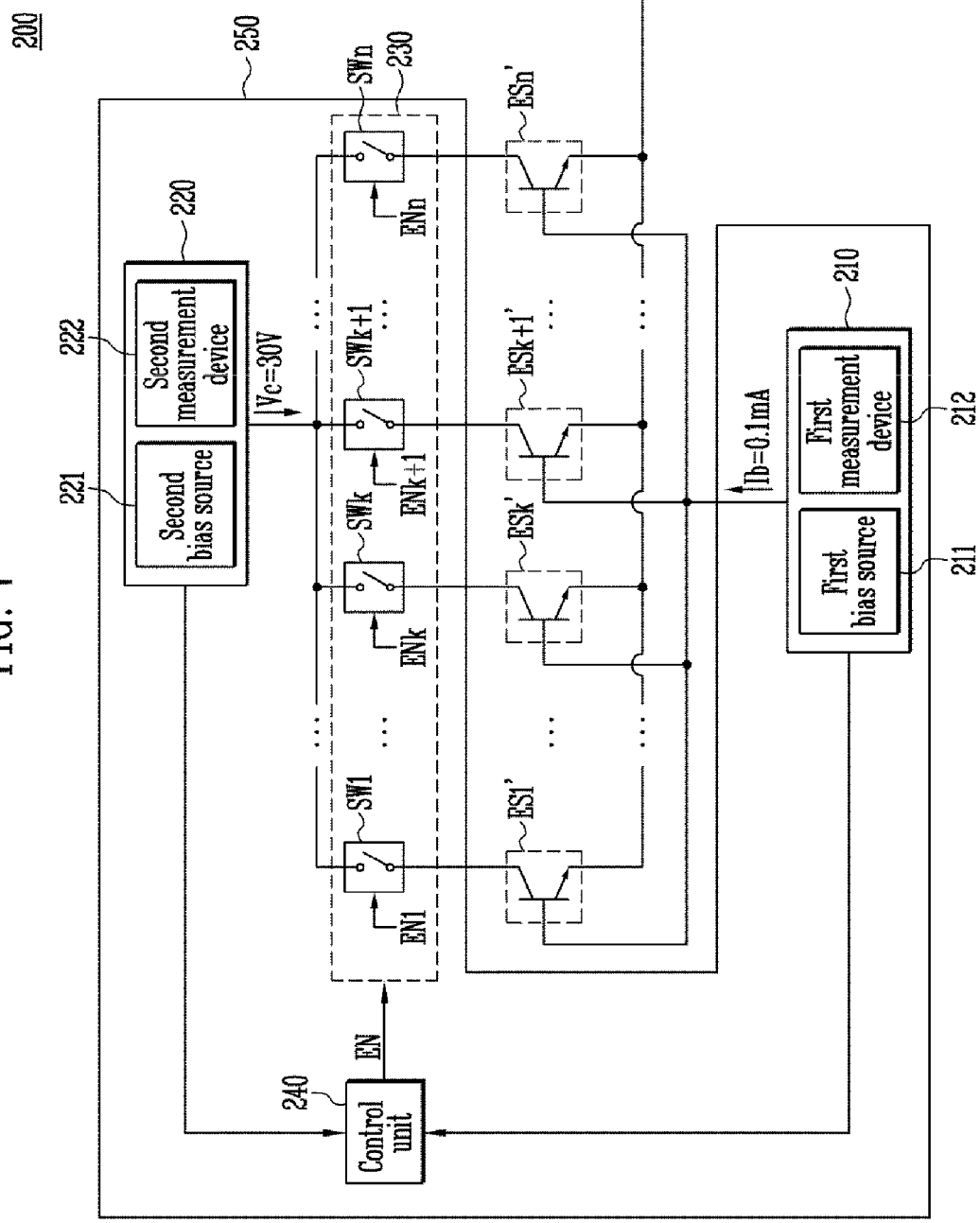
FIG. 7 is a diagram illustrating a test system in a case where each of a plurality of samples is a BJT.

FIG. 7 is a diagram illustrating a test system 200 in a case where each of the plurality of samples ES1 to ESn is a BJT.

Referring to FIG. 7, the test system 200 includes a test device 250 and a plurality of samples ES1' to ESn'. The test device 250 includes a first test unit 210, a second test unit 220, a switching block 230, and a control unit 240.

When each of the plurality of samples ES1' to ESn' is the BJT, a base terminal of each sample is connected to the first test unit 210, a collector terminal of each sample is connected to the second test unit 220 through a corresponding switching unit, and the collector terminal of each sample is connected to a ground. When each of the plurality of samples ES1' to ESn' is the BJT, bias to be applied to the base terminal for the test may be a current, and bias to be applied to the collector terminal may be a voltage. The first test unit 210 supplies a base current Ib, for example, 0.1 mA, and the second test unit 220 supplies a collector voltage Vc, for example, 30 V. A second measurement device 222 of the second test unit 220 may measure a current value of the second measurement line L2.

When each sample is the BJT, a test for an individual sample and the reliability test may be repeated by using the switching units SW1 to SWn.

In addition, may be understood that each sample may be any one among various types of devices. Further, it may be understood that each sample is any one among an element, a function unit, a component, a device, a sub system, and a system.

According to the exemplary embodiment of the present invention, the test system includes the plurality of switching units SW1 to SWn, and each of the plurality of switching units SW1 to SWn is turned on/off, so that an individual sample may be selected and tested. The individual sample test and the reliability test are repeatedly performed, so that the test for a corresponding device may be efficiently performed.

As described above, the embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A test device for testing a plurality of samples, comprising:
   a testing unit connected with a measurement line, and configured to apply bias to the measurement line and measure the measurement line;
   a plurality of switching units configured to electrically connect the plurality of samples, respectively, with the measurement line; and
   a control unit configured to sequentially apply the bias to the plurality of samples by sequentially turning on the plurality of switching units,
   wherein when the bias is applied to each of the plurality of samples, the control unit determines whether a corresponding device sample has a defect based on a first measurement value according to measurement by the testing unit.

2. The test device of claim 1, wherein the control unit controls the plurality of switching units so that second samples, except for one or more first device samples determined to have the defect among the plurality of samples, are biased by the testing unit.

3. The test device of claim 2, wherein the control unit sequentially biases the second samples by sequentially turning on switching units corresponding to the second samples after the second samples are biased.

4. The test device of claim 3, wherein the control unit determines whether a corresponding device sample has a defect based on a second measurement value according to measurement by the testing unit when each of the plurality of samples is biased.

5. The test device of claim 1, wherein the control unit commonly biases the plurality of samples by turning on the plurality of switching units, and then sequentially turns on the plurality of switching units.

6. The test device of claim 5, wherein the control unit receives a second measurement value according to the measurement by the testing unit when the plurality of samples is commonly biased, and sequentially turns on the plurality of switching units according to the second measurement value.

7. The test device of claim 6, wherein the control unit compares the second measurement value with a reference value, and sequentially turns on the plurality of switching units according to a result of the comparison.

8. The test device of claim 5, wherein the control unit biases the plurality of samples by turning on the plurality of switching units for a specific time, and then sequentially turns on the plurality of switching units after elapse of the specific time.

9. The test device of claim 1, further comprising:
   a measurement device configured to measure a bias value applied to a corresponding sample through one among the plurality of switching units,
   wherein the control unit compares a measurement value of the measurement device with a bias value applied by the testing unit, and controls the testing unit so as to adjust the bias value applied by the testing unit according to a result of the comparison.

* * * * *